(12) United States Patent
Jesmanowicz

(10) Patent No.: US 7,807,474 B2
(45) Date of Patent: Oct. 5, 2010

(54) SYSTEM AND METHOD FOR DIRECT DIGITIZATION OF NMR SIGNALS

(75) Inventor: Andrzej Jesmanowicz, Wauwatosa, WI (US)

(73) Assignee: MCW Research Foundation, Inc., Milwaukee, WI (US)

( * ) Notice: Subject to any disclaimer, the term of this patent is extended or adjusted under 35 U.S.C. 154(b) by 511 days.

(21) Appl. No.: 11/690,193

(22) Filed: Mar. 23, 2007

(65) Prior Publication Data

US 2007/0224698 A1   Sep. 27, 2007

Related U.S. Application Data

(60) Provisional application No. 60/743,739, filed on Mar. 24, 2006.

(51) Int. Cl.
G01N 24/00  (2006.01)
(52) U.S. Cl. .............. 436/173; 600/410; 324/307
(58) Field of Classification Search ........... 324/307
See application file for complete search history.

(56) References Cited

U.S. PATENT DOCUMENTS

| | | | |
|---|---|---|---|
| 4,952,877 A | 8/1990 | Stormont et al. | |
| 5,529,068 A | 6/1996 | Hoenninger, III et al. | |
| 5,603,322 A * | 2/1997 | Jesmanowicz et al. | 600/410 |
| 6,080,984 A * | 6/2000 | Friesenhahn | 250/252.1 |
| 6,275,035 B1 * | 8/2001 | Debbins et al. | 324/307 |
| 6,621,433 B1 | 9/2003 | Hertz | |
| 6,624,777 B2 | 9/2003 | Miyano | |
| 6,653,833 B2 | 11/2003 | Baumgartl et al. | |
| 6,977,502 B1 | 12/2005 | Hertz | |
| 2003/0062901 A1 * | 4/2003 | Zhang et al. | 324/322 |
| 2005/0099182 A1 * | 5/2005 | Park et al. | 324/322 |

OTHER PUBLICATIONS

Jerzy Bodurka, Scalable Multichannel MRI Data Acquisition System, MRM 51:165-171 (2004).

Jeff Duyn, Receiver Technology, Advanced MRI, National Institute of Health, USA, pp. 34-35.

A. Jesmanowicz, Direct MRI Detection at 3T Using an FPGA-Controlled High-Speed Digital Receiver, Proc. Intl. Soc. Mag. Reson. Med. 14 (2006).

(Continued)

Primary Examiner—Jill Warden
Assistant Examiner—Timothy G Kingan
(74) Attorney, Agent, or Firm—Quarles & Brady LLP

(57) ABSTRACT

A magnetic resonance imaging (MRI) system includes a transmitter that produces an RF excitation pulse that is applied to a subject positioned in the MRI system to induce emission of at least one of an NMR signal and an ESR signal therefrom, and that produces a reference signal indicative of the phase of the RF excitation pulse. A first analog-to-digital converter has an input for receiving the reference signal that is synchronous with the RF excitation pulse. One or more additional analog-to-digital converters/processors have inputs for receiving the at least one of NMR signals and ESR signals produced by a subject placed in the MRI system and produce one or more complex digital signals therefrom. A normalizer is connected to receive and normalize the digital reference signal and a mixer is connected to receive the normalized digital reference signal and the digital signal. Accordingly, the mixer is operable to multiply the normalized complex digital reference signal with the complex digital signal.

6 Claims, 4 Drawing Sheets

OTHER PUBLICATIONS

G. Neil Holland, Whole Body Magnetic Resonance Spectrometers: All-digital Transmit/Receive Systems, Encyclopedia of Nuclear Magnetic Resonance, vol. 8, 1996, pp. 5010-5014.

Viscor Ivo et al, Two-Channel Digital Receiver as a Measurement Unit; Proc. of the Radioelektronika 2000, Bratislava 2000, pp. 111-32-111-35.

Carl A. Michal et al, A High Performance Digital Receiver for Home-Built Nuclear Magnetic Resonance Spectrometers, American Institute of Physics, Rev. Sci. Instrum. vol. 73, No. 2, Feb. 2002 pp. 453-458.

PCT/US2007/007250 Listing of Documents Considered to Be Relevant.

* cited by examiner

SYSTEM AND METHOD FOR DIRECT DIGITIZATION OF NMR SIGNALS

CROSS-REFERENCE TO RELATED APPLICATIONS

This application is based on provisional application 60/743,739 filed Mar. 24, 2006 and entitled "System and Method for Direct Digitization of NMR Signals" and claims the benefit thereof.

STATEMENT REGARDING FEDERALLY SPONSORED RESEARCH OR DEVELOPMENT

This invention was made with United States government support awarded by the following agencies: NIH Grant No. 5R01EB000215. The United States has certain rights in this invention.

BACKGROUND OF THE INVENTION

The present invention relates generally to magnetic resonance imaging (MRI) systems and, more particularly, to a system and method for receiving and directly digitizing imaging data signals. The invention is capable of utilizing commodity analog-to-digital (A/D) converters and adaptable software-processing algorithms to improve image quality while reducing manufacturing costs.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) that is in the x-y plane and which is near the Larmor frequency, the net aligned moment, $M_z$, may be rotated, or "tipped", into the x-y plane to produce a net transverse magnetic moment, $M_t$. A signal is emitted by the excited spins at or around the Larmor frequency after the excitation signal $B_1$ is terminated that is then received and processed to form an image. The Larmor frequency at a 1.5 Tesla (T) polarizing field strength is around 64 MHz.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MRI signals is received using a receiver coil. The MRI signals are then digitized and processed to reconstruct the image using one of many well-known reconstruction techniques.

To transmit the RF signals that are used to excite the desired spins and receive the resulting MRI data signals, transmit and receive coils or a common transceiver coil is used. The receiver coil (or transceiver coil) receives the MRI data signals excited during the imaging process and provides the data signals to various hardware processing components.

In particular, the signal produced by the subject being imaged in response to excitation by the RF excitation pulses is picked up by a receiver coil and applied through a preamplifier to a receiver amplifier. The receiver amplifier further amplifies the signal by an amount determined by a digital attenuation signal received from the pulse sequence server. Since the received signal is at or around the Larmor frequency and these hardware-based receiver systems cannot provide adequate sampling at such high frequencies, this high frequency signal is down-converted in a two-step process by a down converter that first mixes the imaging signal with the carrier signal and then mixes the resulting difference signal with a reference signal. In this regard, these hardware systems typically down convert the received analog signals to an intermediate frequency that is less than the MRI imaging frequency and then mix it with an analog reference signal.

Only after this conversion and mixing is the signal finally digitized by an analog-to-digital (A/D) converter that samples and digitizes the down-converted/mixed analog signal. Once digitized, the signal is applied to a digital detector and signal processor that produces 16-bit in-phase "I" values and 16-bit quadrature "Q" values corresponding to the received signal. Therefore, only after a variety of significant analog processing steps are the analog signals finally digitized and processed to reconstruct the resulting image.

To carry out these mixing and digitizing processes, hardware systems are employed that are specifically tailored to the particular MRI system with which the mixing and digitizing hardware is to be associated. For example, once the constraints of a particular MRI system are identified (i.e., 1.5 Tesla or 3 Tesla and capable of only echo-planar imaging processes or capable of other fast-spin-echo techniques, such as gradient- and spin-echo processes), hardware that is specifically designed to prepare (i.e., synchronize and digitize) the imaging data received under those constraints is coupled therewith. That is, the hardware is specifically designed and tailored to perform down-conversion, mixing, and analog-to-digital conversion under the specific constraints and parameters (i.e., sampling frequency and MRI frequency) necessary for a given MRI system.

While these hardware-based systems yield suitable results, they are extremely rigid since they are specifically designed and tailored for a particular MRI system. In this regard, although a wide variety of components, such as analog-to-digital converters, are produced as commodity (i.e., low-cost and/or mass-produced) components for use in mass-market devices (e.g., cellular phones and the like), these components cannot be readily utilized in MRI systems without redesigning or reconfiguring the hardware of the receiver system to accommodate the specific functionality of a given commodity component. Furthermore, as various hardware designs and components attain higher bandwidth and dynamic range, these MRI systems cannot harness these capabilities to yield higher quality images without hardware-level redesigns and reconfigurations of the receiver system.

Accordingly, the original manufacturers of MRI systems cannot readily adapt to the fast-paced and ever-changing world market of commodity components because in-depth hardware redesigns and reconfigurations would be required for each and every new chip or board that is selected. Accordingly, though commodity components might provide significant manufacturing savings, the design costs associated with adapting to varying component constraints preclude the realization of such savings.

Similarly, end users cannot simply replace the hardware-based receiver components that were originally included in an MRI system with new components that yield higher bandwidth and/or dynamic range. In this case, though an end user may wish to reap the benefits of newly available components that yield improved image quality, the constraints of the hardware-based receiver system preclude the integration of after-market components into an MRI system.

Therefore, it would be desirable to have a system and method for facilitating the adaptability necessary to accommodate changing component constraints. Furthermore, it would be desirable to allow end users to upgrade the receiver system of a given MRI system to improve image quality without undue reconfiguration and redesign. Additionally, it would be desirable to provide a system and method to facilitate direct detection of MRI imaging data. That is, it would be desirable to have a system and method capable of receiving and digitizing MRI imaging data signals without the need for intermediate analog processing steps, such as intermediate frequency processing.

SUMMARY OF THE INVENTION

The present invention overcomes the aforementioned drawbacks by providing a system and method for utilizing receiver components in MRI receiver systems that are capable of achieving direct detection/digitization of received nuclear magnetic resonance (NMR) signals. As will be described, the present invention, though described with respect to NMR signals, is also capable of receiving and processing other signals, such as electron spin resonance (ESR) signals. Furthermore, the present invention allows A/D conversion systems manufactured as commodity items for integration into mass-market devices such as cellular phones, satellite communications systems, and the like to be utilized in MRI receiver systems. In this regard, the present invention allows traditional A/D converters that are specifically designed for MRI applications to be replaced or forgone in favor of low-cost A/D conversion systems that can be readily mass-produced.

In accordance with one aspect of the invention, a magnetic resonance imaging (MRI) system is disclosed that includes a transmitter that produces an RF excitation pulse that is applied to a subject positioned in the MRI system to induce emission of at least one of an NMR signal and an ESR signal therefrom, and that produces a reference signal indicative of the phase of the RF excitation pulse. The system also includes an RF receiver that has a plurality of digitization channels. One of the channels is configured to digitize the reference signal. Another of the channels is coupled to a coil that receives the at least one of the NMR signal and the ESR signal and is configured to directly digitize the at least one of the NMR signal and the ESR signal. The digitized reference signal forms a reference array and the digitized signal forms a data array. A software mixer then mixes data from the reference array and the data array to generate an imaging data array from which an image can be reconstructed.

In accordance with another aspect of the invention, a method of processing NMR signals is disclosed that includes receiving NMR signals at its Larmor frequency and directly digitizing the NMR signals. The method also includes receiving and digitizing a reference signal produced by an RF transmitter. The method further includes storing the digitized reference signal as a reference array and the digitized NMR signals as a data array. The method further includes mixing the data in the reference array and the digitized NMR data in the data array to generate a phase-accurate NMR data array. The resulting NMR data is k-space data used to reconstruct an MR image of the imaging subject.

In accordance with yet another aspect of the invention, a kit configured to retrofit an RF transceiver system of an MRI system is disclosed that includes an RF receiver circuit having a plurality of analog-to-digital conversion channels. At least one of the channels is configured to digitize a reference phase signal generated by the MRI system. Another of the channels is configured to digitize at least one NMR signal received from a subject in the MRI system. The digitized reference phase signal is arranged as a reference phase array and the digitized NMR signal is arranged as one or more data array(s). The kit also includes a processor configured to normalize the reference phase array to create a complex conjugated array and generate phase-accurate NMR data by mixing the complex conjugated array with the NMR data array(s).

In accordance with another aspect of the invention, an MRI system is disclosed that includes an RF coil assembly configured to transmit RF signals and receive NMR signals at or around the Larmor frequency. The MRI system includes an RF receiver circuit having a plurality of digitization channels, each of which is configured to digitize the NMR signal at its original Larmor frequency.

In accordance with still another aspect of the invention, an MRI system is disclosed that includes an RF receiver circuit having a plurality of digitization channels, one of which is configured to digitize a reference signal and produce phase-accurate MRI data.

Various other features and advantages of the present invention will be made apparent from the following detailed description and the drawings.

DETAILED DESCRIPTION OF THE PREFERRED EMBODIMENT

Figure 1:
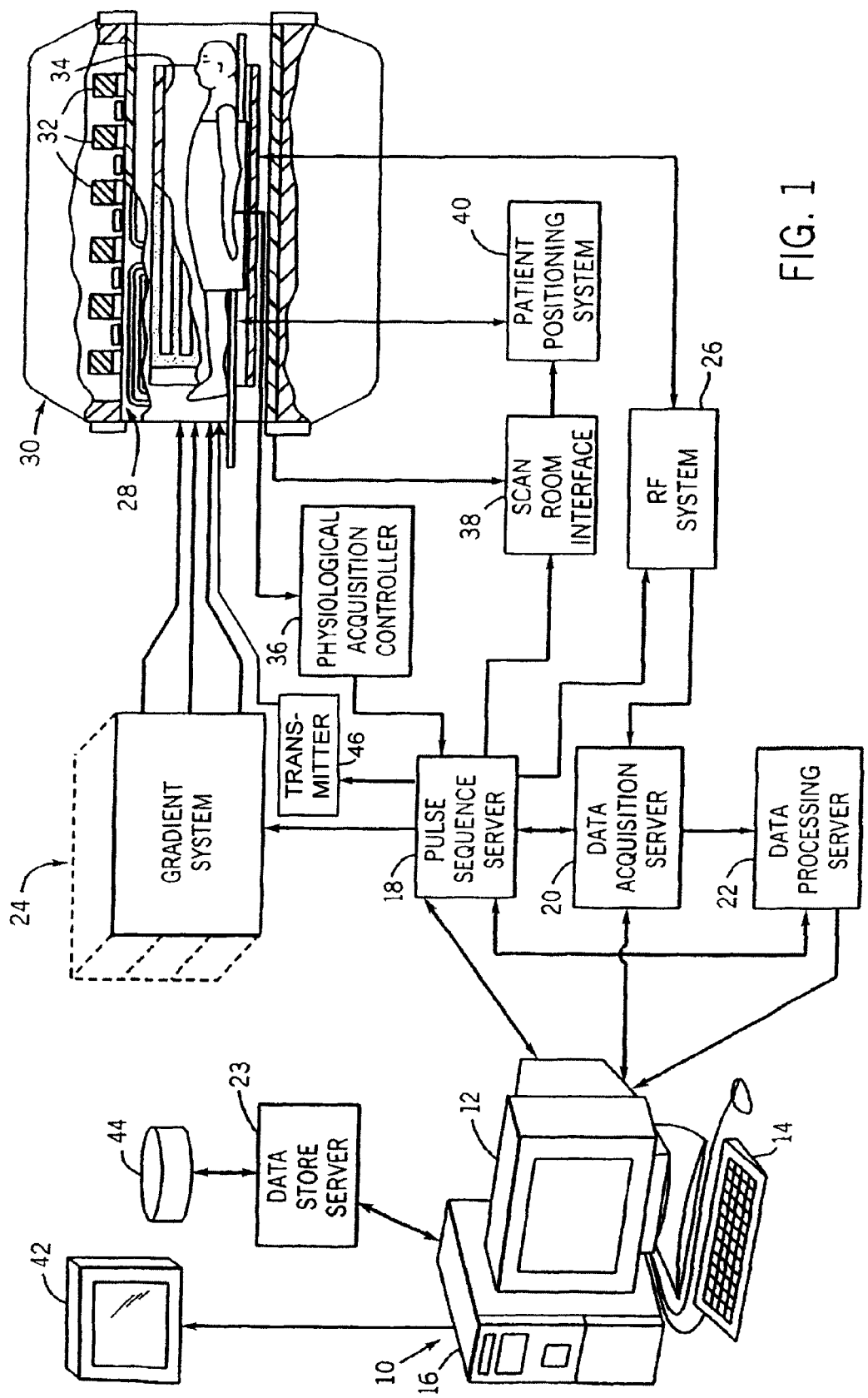
FIG. 1 is a block diagram of an MRI system for use with the present invention.

Referring to FIG. 1, an MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22; and a data store server 23. It is contemplated that the functionality of the data store server 23 may be performed by the workstation processor 16 and associated disc drive interface circuitry or may be a stand-alone computer system. In any case, functionalities of the remaining three servers 18, 20, and 22 are performed by separate processors mounted in a single enclosure and interconnected using a backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors, for example, based on commercially available parallel vector processors.

The workstation 10 and each of the servers 18, 20 and 22 are connected to a serial communications network. This serial network conveys data that is downloaded to the servers 18, 20, and 22 from the workstation 10 and it conveys tag data that is communicated between the servers 18, 20, 22 and the workstation 10. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform a prescribed scan are produced and applied to the gradient system 24 which excites the coils of a gradient coil assembly 28 to produce the magnetic field gradients $G_x$, $G_y$, and $G_z$ used for position-encoding MRI signals. The gradient coil assembly 28 forms part of a magnet assembly 30 which includes a polarizing magnet 32 and an RF coil 34. As will be described below, though a whole-body RF coil 34 is shown, it is contemplated that the present invention may be equally applicable to a wide variety of coil arrangements, such as various local coil configurations and the like.

Furthermore, through a whole-body RF coil 34 and gradient coil assembly 28 is shown within one type of MRI system, it is contemplated that other MRI systems, such as open MRI systems, may be utilized with the present invention. Furthermore, though illustrated as designed for imaging humans, the present invention may also be used with MRI systems designed to image animals and other objects. Furthermore, though described with respect to MR imaging, the present invention may also be used with other MR systems, such as MR spectroscopy systems or systems designed for non-medical purposes.

During an imaging process, RF excitation waveforms are applied to the RF coil 34 by the RF system 26 to perform the prescribed magnetic resonance pulse sequence. Responsive thereto, MRI or imaging data signals are detected by the RF coil 34 and received by the RF system 26 and processed under direction of commands produced by the pulse sequence server 18. As will be described in detail below, the RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase, and pulse amplitude waveform. In this regard, the generated RF pulses may be applied to the whole body RF coil 34 or to one or more local coils or coil arrays.

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to "gate" the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized MRI signal samples produced by the RF system 26 are received by the data acquisition server 20. The data acquisition server 20 operates in response to description components downloaded from the workstation 10 to receive the real-time imaging data and provide buffer storage such that no data is lost by data overrun. In some scans the data acquisition server 20 does little more than pass the acquired imaging data to the data processing server 22. However, in scans that require information derived from acquired imaging data to control the further performance of the scan, the data acquisition server 20 is programmed to produce such information and convey it to the pulse sequence server 18. For example, during prescans, imaging data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MRI signals used to detect the arrival of contrast agent in an MRI scan. In all these examples, the data acquisition server 20 acquires MRI data and processes it in real-time to produce information that is used to control the scan.

The data processing server 22 receives imaging data from the data acquisition server 20 and processes it in accordance with description components downloaded from the workstation 10. Such processing may include, for example: Fourier transformation of raw k-space MRI data to produce two or three-dimensional images; the application of filters to a reconstructed image; the performance of a back-projection image reconstruction of acquired MRI data; the calculation of functional MR images; the calculation of motion or flow images; and the like.

Images reconstructed by the data processing server 22 are conveyed back to the workstation 10 where they are stored. Real-time images are stored in a database memory cache (not shown) from which they may be delivered to the operator display 12 or another display 42, such as may be located near the magnet assembly 30 for use by attending physicians. Batch mode images or selected real-time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
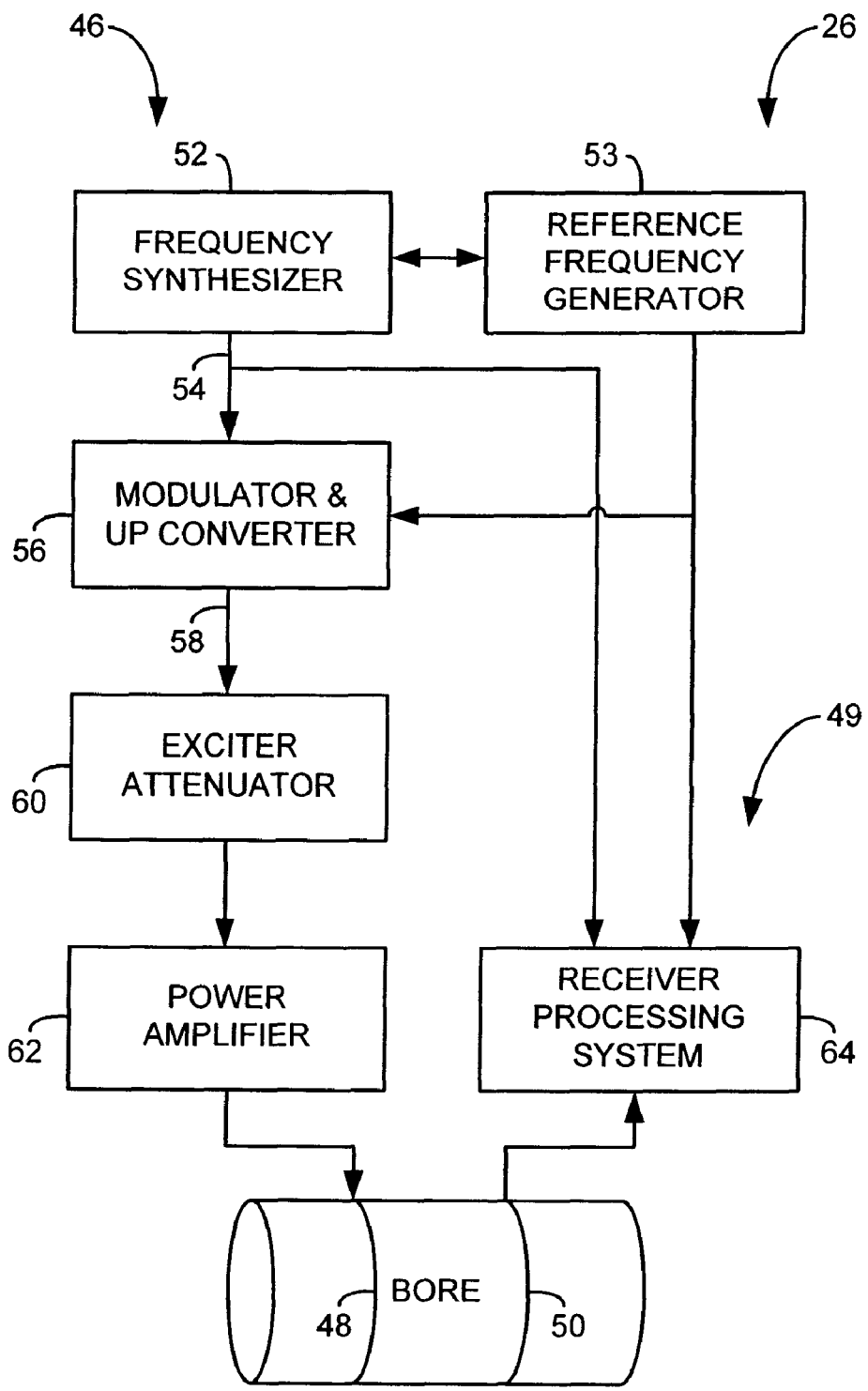
FIG. 2 is a schematic representation of a transceiver system for use with the MRI system of FIG. 1 and incorporating a receiver system in accordance with the present invention.

As shown in FIG. 1, the RF system 26 may be connected to the whole body RF transceiver coil 34, or as shown in FIG. 2, a transmitter section 46 of the RF system 26 may connect to one RF coil 48 and a receiver section 49 may connect to a separate RF receive coil 50. Often, the transmitter section 46 is connected to a whole-body RF coil 34 and each receiver section is connected to a separate local coil 50. Multi-channel receivers have become available in recent years to practice SENSE, SMASH, and GRAPPA imaging methods.

Continuing with respect to FIG. 2, the RF system 26 includes a transmitter 46 that produces a prescribed RF excitation field. The base, or carrier, frequency of this RF excitation field is produced under control of a frequency synthesizer 52 that receives a set of digital signals from the pulse sequence server 18 of FIG. 1, as well as a reference signal that is produced by a reference frequency generator 53. These digital signals indicate the frequency and phase of the RF carrier signal produced at an output 54 of the frequency synthesizer 52. The RF carrier is applied to a modulator and up converter 56 where the amplitude is modulated in response to a signal, R(t), that is also received from the pulse sequence server 18 of FIG. 1. The signal R(t) defines the envelope of the RF excitation pulse to be produced and is generated by sequentially reading out a series of stored digital values. These stored digital values may be changed to enable any desired RF pulse envelope to be produced.

The magnitude of the RF excitation pulse produced at the output 58 of the modulator/up converter 56 is attenuated by an exciter-attenuator circuit 60 that receives a digital command from the pulse sequence server 18 of FIG. 1. The attenuated RF excitation pulses are applied to a power amplifier 62 that drives the RF coil 48.

Figure 3:
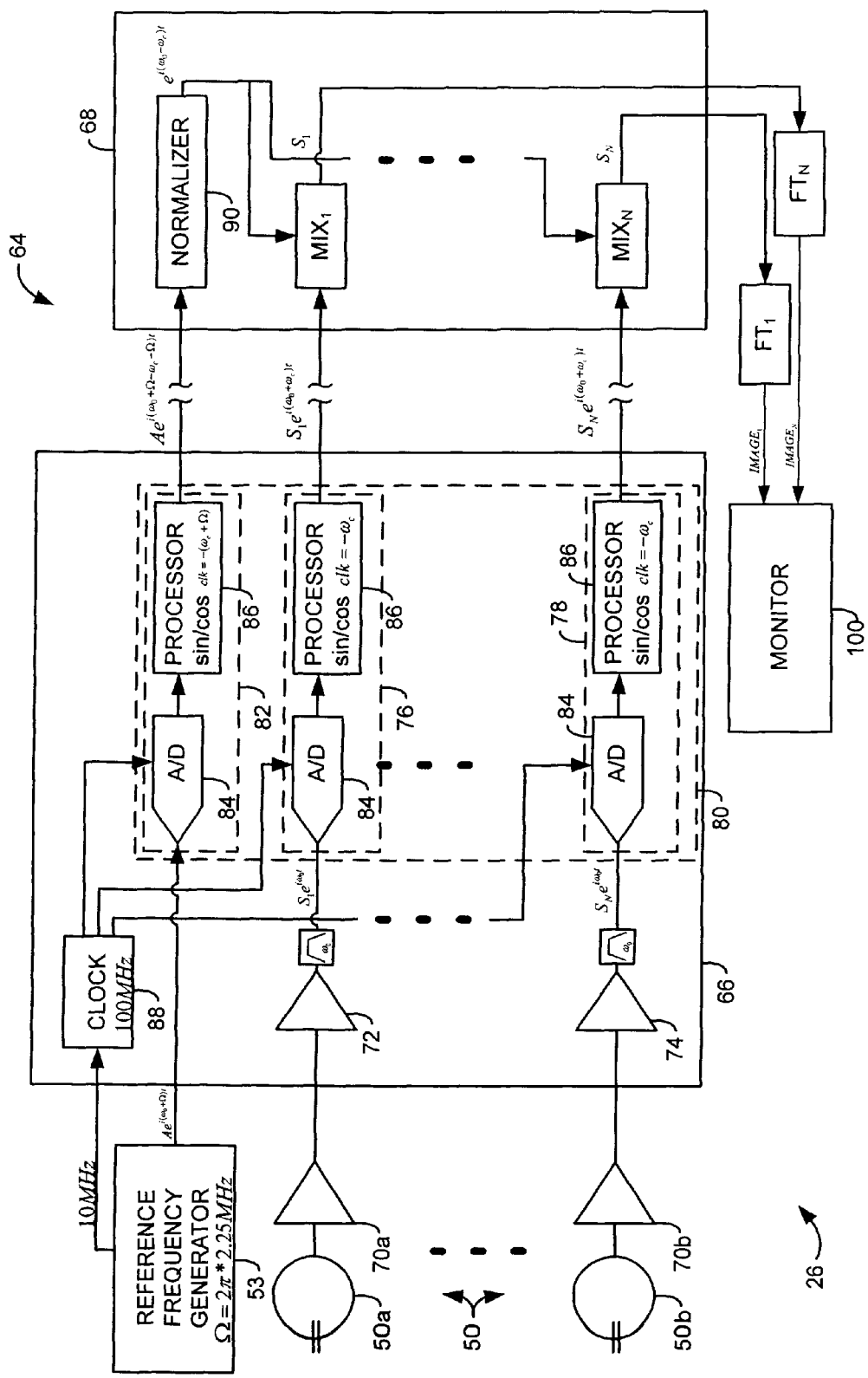
FIG. 3 is a block diagram showing the components of a receiver system in accordance with one embodiment of the present invention.

The NMR signal produced by the subject being imaged in response to excitation by the RF excitation pulses is picked up by the receiver coil 50 and coupled to a receiver processing system 64. The received NMR signal is at or around the Larmor frequency. This frequency will depend on the strength of the polarizing field $B_0$, but in any case, it is a very high frequency (e.g., approximately, 42 MHz/Tesla). Referring now to FIG. 3, the receiver processing system 64 includes a section implemented in hardware indicated at 66 and a section implemented in software indicated at 68. As will be described, the present invention has moved some of the functionality typically embodied in hardware into the software section 68. As a result, the present invention allows for direct digitization of NMR signals and moves functions to software to allow greater adaptability and functionality that can be harnessed by original manufacturers to realize production cost savings and utilized by end users to yield increased image quality.

Continuing with respect to FIG. 3, the received NMR signals acquired by the receiver coil 50 are passed to a preamplifier 70. Thereafter, the imaging data signals are passed to amplifiers/filters 72, 74 that are dedicated to respective receiver channels 76, 78 of the hardware system 66. Additionally, a variety of filters may be associated with each receiver channel 76, 78 to limit their bandwidth around the Larmor frequency. Additionally or alternatively, though FIG. 3 illustrates that the receiver coil 50 includes two receiver coils 50*a* and 50*b* that provide the NMR signal to respective preamplifiers 70*a*, 70*b* and receiver channels 76, 78, it is contemplated that a multiplicity of individual receiver coils may be dedicated to respective receiver channels. Furthermore, though FIG. 3 shows a single board 80 having three channels 76, 78, 82, it is contemplated that each board 80 may include a number of channels, for example, four. Furthermore, it is contemplated that multiple boards may be included to provide 128 channels or virtually any number of receiver channels.

For example, it is contemplated that each channel 76, 78, 82 may be a quad-channel receiver. Each receiver channel 76, 78, 82 includes an analog-to-digital (A/D) converter 84 and a processor 86. In particular, the receiver may be an Echotek receiver. Echotek is a registered trademark of Mercury Computer Systems, Inc. of Chelmsford, Mass. In this regard, for example, each board 80 may be an ECDR-GC314 board, whereby the A/D converters 84 are three 14-bit, 200 MHz Analog Devices AD6645 converters clocked at 100 MSPS and the processors 86 are Graychip 4016 quad digital receivers. ECDR-GC314 boards are also commercially available from Mercury Computer Systems, Inc. of Chelmsford, Mass. However, it is contemplated that for MRI applications, the standard bandwidth of each anti-alias filter, which is 50 MHz (half of the sampling rate), may be reduced by a decimation of 1024 to increase the dynamic range by 5 bits. Accordingly, each A/D converter 84 acts as a 19-bit converter. In general, the bandwidth of a given chip may be decreased by $4^N$, where N is the number of bits of dynamic range increase of the assembly over the dynamic range of the A/D converter. Hence, the system may be adapted to utilize a wide variety of chips that are currently available, such as a Field Programmable Gate Array (FPGA), or even chips that have yet to be developed.

Accordingly, as will be described, by adapting these components to be usable in MRI systems, an MRI receiver system is created that is capable of achieving direct detection/digitization of MRI imaging data. That is, MRI imaging data can be received and digitized without the need for intermediate frequency processing or other analog processing steps. As such, higher quality images can be produced by a given scanner that would not be possible using the receiver components included in the original MRI system.

The RF system 26 may include two or more channels. In particular, the RF system 26 may include up to N+1 channels, where N is an integer. That is, at least one channel 82 is dedicated to digitizing and processing a reference signal from the reference frequency generator 53 that is used to synchronize the phase of the acquired NMR data, which is digitized and processed by the other channel(s). As stated, each channel 76, 78, 82 is capable of direct digital detection of RF signals that are "phase coherent" with the RF excitation pulses produced by the transmitter. Accordingly, it is contemplated that the reference frequency generator 53 may be directly digitized by a dedicated channel 82.

Hence, the RF system 26 will include at least one additional digitizing channel 76, 78, 82 than the number of receiver channels. Typically, a given MRI system may have anywhere from 2 to 96, or even more, receiver channels that may be connected to a corresponding plurality of local coils or to a corresponding plurality of coil elements in a coil array.

When the NMR signal is received by the receiver coil 50, the NMR signal is at or around the Larmor frequency. In a traditional MRI receiver system, this high frequency signal is down-converted in a one- or two-step process by a down converter that first mixes the NMR signal with the RF carrier signal and then mixes the resulting difference signal with the reference/synchronization signal. Thus, in traditional MR systems, all mixing is performed using analog signals. However, in the present invention, the use of A/D converters 84 with high bandwidth and high dynamic range enables detection at the MRI Larmor frequency as opposed to some intermediate frequency.

Accordingly, the present invention provides true "direct detection" of MRI imaging data at the same frequency as the RF excitation signal applied to the imaging subject. This is true, for example, even when performing three-dimensional (3D) imaging processes with magnetic field strengths of 3 Tesla (T) or greater. For example, the RF MRI imaging signal that is received may correspond to the proton magnetic resonance frequency when subjected to a static magnetic field strength of 3T or greater and, still, down conversion to an intermediate frequency or similar analog processing is not necessary prior to digitization.

The A/D converters 84 utilize a signal from a common clock 88 around which to digitize the received signal. After processing in processor 86, the resulting I and Q digital values are then passed from the hardware section 66 to the software section 68. The software section 68 includes a processor that is programmed with stored "firmware" to carry out the following functions. These include a normalizer 90 that normalizes the digital I and Q values in the reference array generated from the phase reference signal. In particular, the array of values is normalized using a value (alpha) that is the arctan of I divided by Q. Accordingly, a complex conjugated array of I and Q values is created where:

$$\alpha = \tan^{-1} I/Q;$$

$$I_{normalized} = \sin(\alpha);$$

$$Q_{normalized} = \cos(\alpha);$$

The values in the normalized reference array are then mixed by complex multiplication with the corresponding values in each array of imaging data from each channel in the hardware section 66. This synchronizes the phases of the acquired I and Q pairs with the reference signal and RF phase of the excitation pulse. As is known, mixing the NMR data with the reference signal, albeit while traditionally performed in hardware and using analog signals, reduces artifacts in a reconstructed image that are attributable to spurious harmonics of hardware mixers and direct current (DC) interference in the imaging data signals. The mixed I and Q pairs then form raw "k-space" data that is sent to the data processing server 22 for image reconstruction.

While in the present invention the mixing is performed in software rather than hardware, the functional result is unchanged. However, unlike hardware-based systems, by performing normalization and mixing in software, the receiver processing system 64 is sufficiently flexible to adapt to variations in the reference frequency provided by the reference frequency generator 53, which is part of the fundamental hardware design of the MRI scanner. Accordingly, by performing mixing and normalization in software, it is possible to adapt to a wide variety of MRI scanners, each having slightly varied reference signals generated by slightly different reference frequency generators. Similarly, by performing mixing and normalization in software, it is possible to adapt to a wide variety of A/D converters and/or processors. In this regard, the receiver system can be easily adapted to accommodate a given board 80 that may be desirable because of increased bandwidth or decreased cost, such as is common in mass-produced commodity components.

Hence, the present invention allows a variety of commercially available receiver components to be utilized in MRI receiver systems. For example, the present invention allows A/D conversion systems manufactured as commodity items for integration into mass-market devices such as cellular phones, satellite communications systems, and the like to be utilized in MRI receiver systems. In this regard, the present invention allows traditional A/D converters that are specifically designed for MRI applications to be replaced or forgone in favor of low-cost A/D conversion systems that can be readily mass-produced. As such, a significant cost savings can be realized by a scanner manufacturer by having the flexibility to readily incorporate newly available components or components that are already available into a particular scanner design without having to perform significant hardware redesigns.

Furthermore, it is contemplated that the receiver processing system 64 may be easily incorporated into a kit designed to retrofit any of a variety of traditional MRI systems having integrated hardware receiver systems to allow end users to accommodate the bandwidth, Larmor frequency, and dynamic range available in newly designed or available components. Accordingly, the receiver processing system 64 may be embodied as a kit that can be attached to a given MRI scanner to bypass the internal hardware-based receiver system of the scanner and provide higher quality images.

Figure 4:
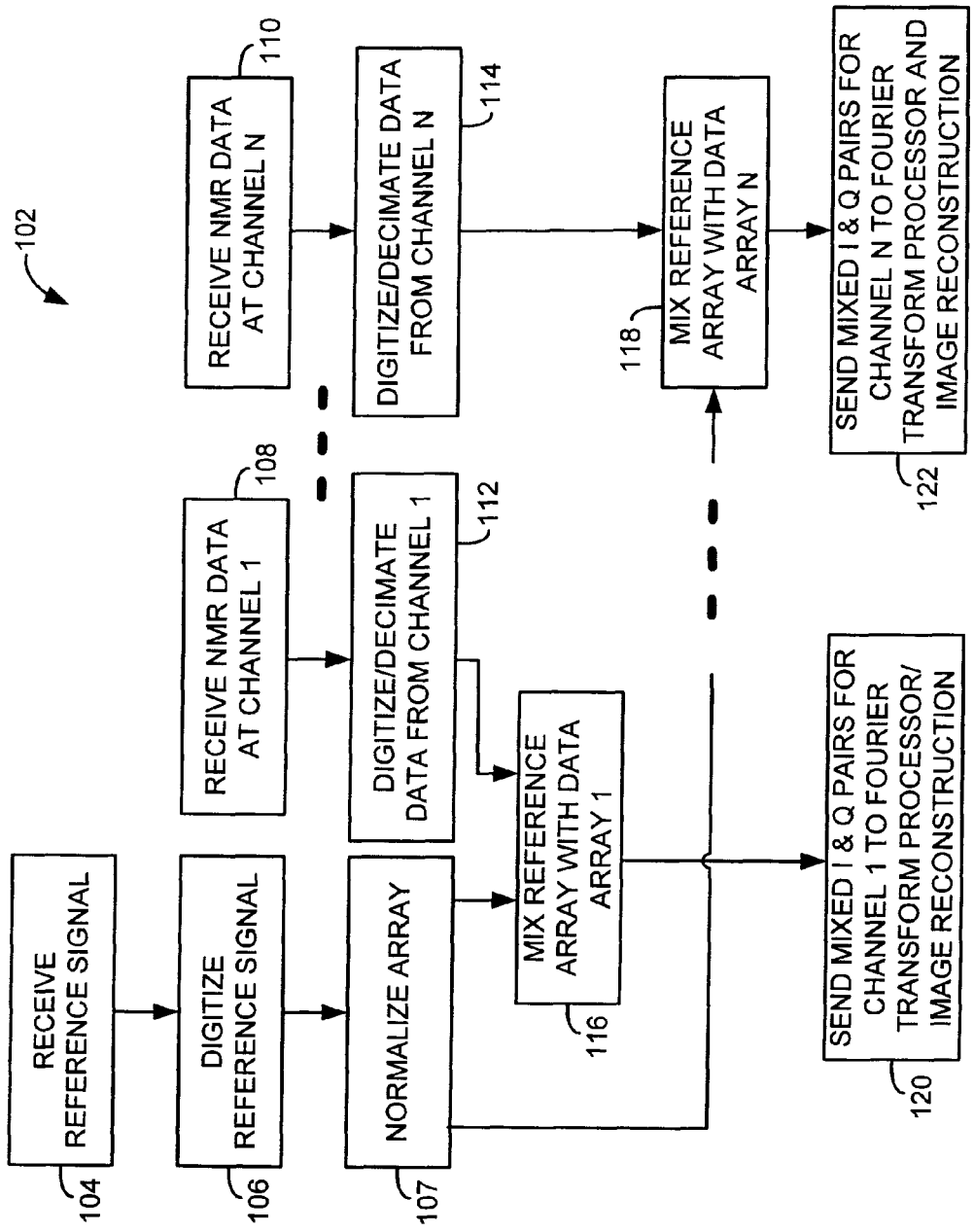
FIG. 4 is a flow chart setting forth the steps of a technique for receiving and processing MRI information in accordance with the present invention.

Referring now to FIG. 4, the functionality of the above-described receiver processing system 64 is set forth as a process 102. The reference signal is received 104 from the reference frequency generator 53 of the associated MRI system. The reference signal is then digitized and saved as an array of I and Q pairs 106 and normalized 107 to create a new complex array of I and Q pairs, as described above. Simultaneously therewith, NMR data is received at each channel 108, 110 (channel 1 through channel N). These NMR signals at each channel are digitized 112, 114 and processed to be saved as an array of I and Q pairs.

Thereafter, the arrays of I and Q pairs for channels 1 through N are mixed with the normalized, complex reference array 116, 118. The software system then returns the data associated with each channel to the MRI system for image reconstruction 120, 122.

While the above-described systems and methods have been described with respect to NMR signals, it is contemplated that other imaging signals, such as electron spin resonance (ESR) signals may also be utilized. Hence, the present invention provides a system and method for utilizing receiver components in MRI receiver systems that are capable of achieving direct detection/digitization of MRI imaging data. That is, the above-described system and method facilitates the ability to utilize components having an inherently high bandwidth and dynamic range so that MRI imaging data can be received and digitized without the need for intermediate frequency processing. Accordingly, reference frequency mixing can be performed following digitization. Higher quality images can be produced by a given scanner that would not be possible using the receiver components included in the original MRI system.

Additionally, the present invention provides a system and method for allowing manufacturers to use low-cost, mass-produced components in MRI receiver systems by facilitating the adaptability necessary to accommodate changing component constraints. Furthermore, the above-described systems and methods allow end users to upgrade a receiver system of a given MRI system to improve image quality without undue reconfiguration and redesign.

Beyond the embodiments and operating environments described above, it is contemplated that the present invention may be used with 3D imaging processes, such as described above, where the imaging scan is directed to the breast, liver, or other area of the patient. Furthermore, it is contemplated that the present invention may be advantageously utilized with systems and processes utilizing a modified reconstruction algorithm, such as cardiac breath-hold applications, to produce an image of relatively high quality in an advantageously reduced time. Similarly, the present invention may be utilized with modified reconstruction algorithms to detect extremity anomalies at the edge of the image.

Therefore, the present invention has been described in terms of the preferred embodiments, and it should be appreciated that many equivalents, alternatives, variations, and modifications, aside from those expressly stated, are possible and within the scope of the invention. Therefore, the invention should not be limited to a particular described embodiment.

The invention claimed is:

1. A method of processing an NMR signal received by a coil, the method comprising steps of:
    (A) directly digitizing the NMR signal received by the coil without down-converting the NMR signal to a frequency below the Larmor frequency;
    (B) receiving and digitizing a reference signal from an MRI system, the reference signal indicating a phase of an RF excitation pulse produced by the MR system to induce the NMR signal;
    (C) normalizing the digitized reference signal; and
    (D) mixing the normalized digital reference signal with the digitized NMR signal.

2. The method of claim 1 further comprising adjusting at least one of steps (A) through (D) to compensate for one of a plurality of MR imaging frequencies and reference signals specific to one of the plurality of MRI systems.

3. The method of claim 1 wherein step (D) includes mixing the digitized reference signal and the digitized NMR signal to generate a phase-accurate array of NMR data.

4. The method of claim 1 wherein steps (C) and (D) are performed by a processor executing a computer program stored on a computer readable storage medium.

5. The method of claim 1 wherein step (D) includes mixing a complex conjugate of the digitized reference signal with the digitized NMR signal to generate a phase-accurate array of NMR data that can be used to reconstruct one of a two-dimensional (2D) image and a three-dimensional (3D) image.

6. The method of claim 1 wherein step (A) further includes directly digitizing the NMR signal using a plurality of additional analog-to-digital converters and producing respective complex digital NMR signals therefrom and wherein step (D) further includes mixing the normalized digital reference signal with each digital NMR signal produced by the plurality of analog-to-digital converters.

* * * * *